(12) United States Patent
Masumura (10) Patent No.: US 9,266,216 B2
(45) Date of Patent: Feb. 23, 2016

(54) POLISHING HEAD AND POLISHING APPARATUS

(71) Applicant: SHIN-ETSU HANDOTAI CO., LTD., Tokyo (JP)

(72) Inventor: Hisashi Masumura, Yabukimachi (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 0 days.

(21) Appl. No.: 14/373,672

(22) PCT Filed: Jan. 28, 2013

(86) PCT No.: PCT/JP2013/000422
§ 371 (c)(1),
(2) Date: Jul. 22, 2014

(87) PCT Pub. No.: WO2013/121706
PCT Pub. Date: Aug. 22, 2013

(65) Prior Publication Data
US 2015/0017890 A1   Jan. 15, 2015

(30) Foreign Application Priority Data

Feb. 15, 2012  (JP) ................................ 2012-030488

(51) Int. Cl.
*B24B 37/10*   (2012.01)
*B24B 37/32*   (2012.01)
(Continued)

(52) U.S. Cl.
CPC ................ *B24B 37/10* (2013.01); *B24B 37/30* (2013.01); *B24B 37/32* (2013.01); *H01L 21/02024* (2013.01); *H01L 21/304* (2013.01); *H01L 2221/683* (2013.01)

(58) Field of Classification Search
CPC .......... B24B 7/10; B24B 37/30; B24B 37/32; H01L 21/304; H01L 21/02024; H01L 2221/683
See application file for complete search history.

(56) References Cited

U.S. PATENT DOCUMENTS

| 5,913,719 A | 6/1999 | Hasegawa et al. |
| 5,921,853 A | 7/1999 | Nishio |

(Continued)

FOREIGN PATENT DOCUMENTS

| CN | 1138745 A | 12/1996 |
| CN | 1440321 A | 9/2003 |

(Continued)

OTHER PUBLICATIONS

Oct. 7, 2014 Office Action issued in Japanese Application No. 2012-030488.

(Continued)

*Primary Examiner* — Dung Van Nguyen
(74) *Attorney, Agent, or Firm* — Oliff PLC (57) ABSTRACT

The present invention provides a polishing head including: an annular rigid ring; an elastic film bonded to the rigid ring; and an upward and downward movable mid-plate, the mid-plate defining a first sealed space together with the rigid ring and the elastic film; an incompressible fluid enclosed in a sealed space; and a mid-plate positioning device for adjusting vertical position of the mid-plate, to hold a back surface of a workpiece on a lower surface of the elastic film and polish a front surface by bringing the front surface into contact with a polishing pad attached to a turn table, wherein the mid-plate can adjust a shape of the lower surface of the elastic film by adjusting the vertical position of the mid-plate. The polishing head polishes a workpiece without generating surface defects on the workpiece surface and easy detachment of the workpiece from a polishing pad after polishing.

15 Claims, 10 Drawing Sheets

(51) Int. Cl.
*H01L 21/304* (2006.01)
*B24B 37/30* (2012.01)
*H01L 21/02* (2006.01)

(56) References Cited

U.S. PATENT DOCUMENTS

| | | | |
|---|---|---|---|
| 6,113,480 A * | 9/2000 | Hu et al. | 451/289 |
| 6,196,905 B1 * | 3/2001 | Inaba | 451/288 |
| 6,231,428 B1 * | 5/2001 | Maloney et al. | 451/41 |
| 6,273,804 B1 * | 8/2001 | Numoto | 451/288 |
| 6,494,774 B1 * | 12/2002 | Zuniga et al. | 451/398 |
| 6,652,362 B2 * | 11/2003 | Boo et al. | 451/41 |
| 7,001,245 B2 * | 2/2006 | Chen | 451/8 |
| 2002/0177394 A1 | 11/2002 | Hollatz et al. | |
| 2003/0008604 A1 * | 1/2003 | Boo et al. | 451/388 |
| 2003/0203708 A1 * | 10/2003 | Liu et al. | 451/53 |
| 2005/0028931 A1 | 2/2005 | Fukaya et al. | |
| 2008/0119122 A1 | 5/2008 | Zuniga et al. | |
| 2009/0291623 A1 | 11/2009 | Masumura et al. | |
| 2010/0291838 A1 | 11/2010 | Masumura et al. | |
| 2011/0053474 A1 | 3/2011 | Moriya et al. | |
| 2012/0040592 A1 * | 2/2012 | Chen et al. | 451/53 |

FOREIGN PATENT DOCUMENTS

| | | |
|---|---|---|
| CN | 101528416 A | 9/2009 |
| CN | 101801605 A | 8/2010 |
| JP | A-9-225819 | 9/1997 |
| JP | 2002359214 A | 12/2002 |
| JP | A-2003-165051 | 6/2003 |
| JP | A-2005-14128 | 1/2005 |
| JP | A-2008-110407 | 5/2008 |
| JP | 2008-142884 A | 6/2008 |
| JP | 2008-302464 A | 12/2008 |
| JP | A-2009-107094 | 5/2009 |
| JP | 2011051047 A | 3/2011 |
| WO | 01/87541 A2 | 11/2001 |

OTHER PUBLICATIONS

Aug. 19, 2014 International Preliminary Report on Patentability issued in International Application No. PCT/JP2013/000422.

Apr. 23, 2013 International Search Report issued in International Application No. PCT/JP2013/000422.

Feb. 3, 2015 Office Action issued in Japanese Application No. 2012-030488.

Nov. 2, 2015 Office Action issued in Chinese Application No. 201380009156.x.

* cited by examiner

THE NUMBER OF DEFECTS: 18

FIG. 12B

THE NUMBER OF DEFECTS: 216

FIG. 12C

THE NUMBER OF DEFECTS: 684

POLISHING HEAD AND POLISHING APPARATUS

TECHNICAL FIELD

The present invention relates to a polishing head for holding a workpiece when a front surface of the workpiece is polished and a polishing apparatus provided with the polishing head, particularly to a polishing head for holding a workpiece on an elastic film and a polishing apparatus with the polishing head.

BACKGROUND ART

In recent years, higher integration of semiconductor devices places demand for higher flatness of semiconductor wafers used in such devices. The higher flatness up to near the edge of wafers is also needed to raise the yield of semiconductor chips.

The shape of finished semiconductor wafers depends on a final mirror polishing process. For a 300-mm-diameter silicon wafer, in particular, primary polishing by double-side polishing is performed to meet strict specifications of the flatness, and then secondary polishing and finish polishing by single-side polishing are performed to remove scratches on a wafer surface or to improve surface roughness.

The secondary polishing and finish polishing by single-side polishing need to maintain or improve flatness obtained by the primary polishing by double-side polishing and to finish the front surface of a wafer into a perfect mirror-surface with no defects, such as scratches.

Figure 13:
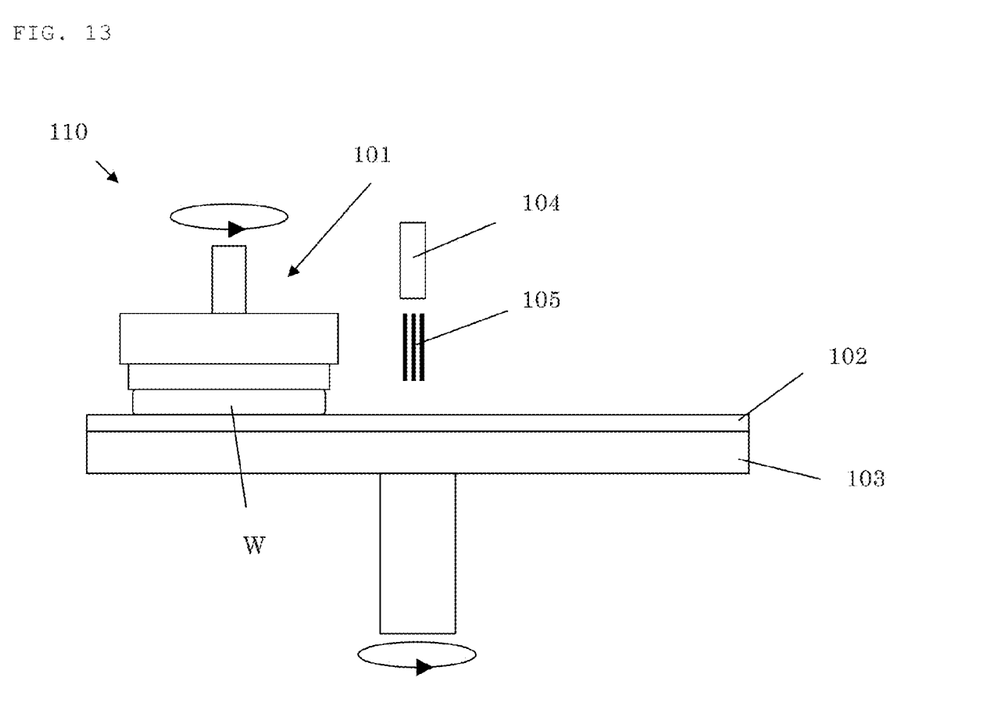
FIG. 13 is a schematic diagram of an example of a conventional polishing apparatus.

As shown in FIG. 13, for example, a typical single-side polishing apparatus includes a turn, table 103 to which a polishing pad 102 is attached, a polishing-agent-supply mechanism 104, a polishing head 101. Such a polishing apparatus 110 holds a workpiece W with the polishing head 101, supplies a polishing agent 105 from the polishing-agent-supply mechanism 104 onto the polishing pad 102, rotates both the turn table 103 and the polishing head 101, and polishes the workpiece W by bringing a front surface of the workpiece into sliding contact with the polishing pad 102.

Figure 14:
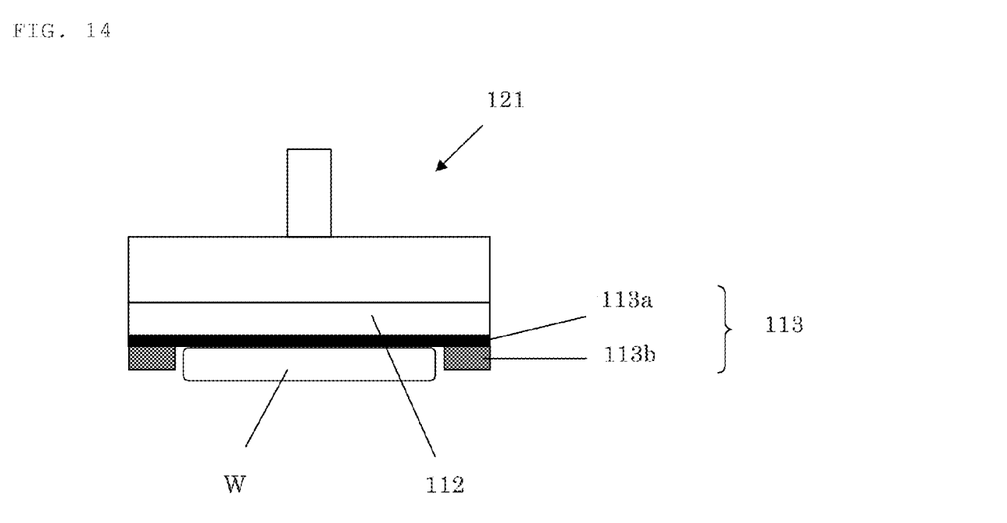
FIG. 14 is a schematic diagram of an example of a conventional polishing head with a backing film.

One exemplary method of holding a workpiece with a polishing head is to attach the workpiece to a flat workpiece-holding board through an adhesive such as wax. As shown in FIG. 14, there is also a polishing head 121 of a waxless type that holds a workpiece W with a commercially available template assembly 113 adhering to a workpiece-holding board 112. The template assembly has a template 113b, for preventing the workpiece from coming off, attached to an elastic film 113a called a backing film.

Figure 15:
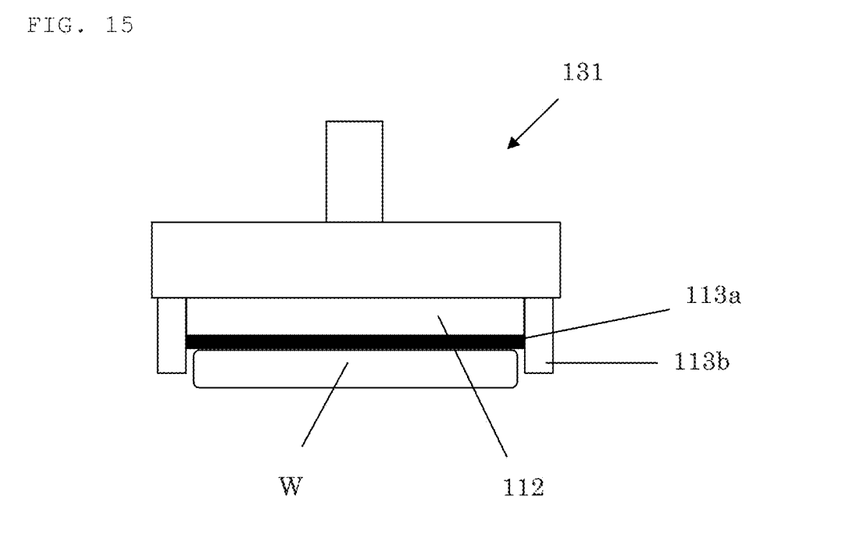
FIG. 15 is a schematic diagram of another example of a conventional polishing head with a backing film.

Other exemplary polishing heads of a waxless type currently used include a polishing head 131, as shown in FIG. 15, that includes a backing film 113a attached to a surface of a workpiece-holding board 112, instead of the commercially available template, and an annular guide ring 113b, for preventing a workpiece from coming off, provided around the side surface of the workpiece-holding board.

Although the workpiece holding board 112 is commonly composed of a highly-flat ceramic plate, this polishing head has a problem in that variation in thickness of the backing film 113a, etc., produces a small pressure distribution, resulting in waviness of the polished front surface of the workpiece and hence there is a problem that deteriorates the flatness of the workpiece.

Accordingly, there is also disclosed the so-called rubber chuck type of polishing head having a rubber film for holding a workpiece in place of the workpiece-holding board, in which the workpiece is pressed against a polishing pad by supplying pressurized fluid, such as air, to the back surface of the rubber film to inflate the rubber film with a uniform pressure (see Patent Document 1, for example).

Figure 16:
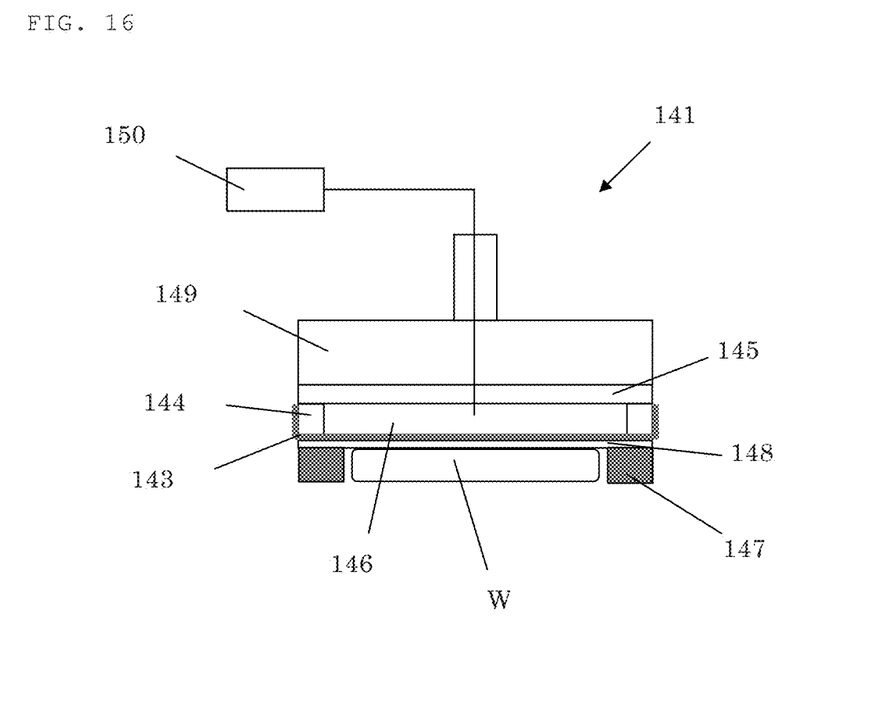
FIG. 16 is a schematic diagram of an example of a conventional polishing head of rubber-chuck type.

FIG. 16 schematically illustrates an example of a configuration of the rubber chuck type of polishing head. The essential parts of the polishing head 141 are an annular rigid ring 144 made of e.g., stainless steel, a rubber film 143 attached to the rigid ring 144, and a back plate 145 connected to the rigid ring 144. The rigid ring 144, the rubber film 143, and the back plate 145 define a sealed space 146. On a lower surface portion of the rubber film 143, a backing film 148 is attached, and an annular template 147 is provided concentrically with the rigid ring 144. Pressurized fluid is supplied through the center of the back plate 145 with a pressure-adjusting mechanism 150 to adjust the pressure in the sealed space 146. The back plate 145 is connected to a polishing head body 149 having a pressing means (not shown) for pressing the back plate 145 toward a polishing pad.

CITATION LIST

Patent Literature

Patent Document 1: Japanese Unexamined Patent publication (Kokai) No. 2003-110407
Patent Document 2: Japanese Unexamined Patent publication (Kokai) No. H09-225819

SUMMARY OF INVENTION

Technical Problem

Use of such a rubber chuck type of polishing head prevents the small pressure distribution due to the variation in backing film thickness, and hence the waviness of tune polished front surface of the workpiece. Since the template has an inner diameter larger than an outer diameter of the workpiece, there is a small gap between the template and the workpiece. At this gap between the template and the workpiece, the rubber film inflates largely, when the pressurized fluid is supplied to the interior of the sealed space with the pressure adjusting mechanism to adjust the pressure as above. This inflation increases the pressure on an outer peripheral portion of the workpiece and lead to excessive polishing at this outer peripheral portion, and thereby an outer circumference sag tends to occur.

Adjusting the thickness of the template allows the pressure on the outer peripheral portion of the workpiece to be adjusted to some extent, but variation in thickness of the template varies a polishing stock removal of the outer peripheral portion of the workpiece; consequently, the acquired flatness becomes unstable.

In final polishing of a workpiece, the template is preferably kept from contacting a polishing pad for final polishing, because an extraneous substance, separated from the template when the template contacts the polishing pad, and the like creates a defect, such as a scratch, on the front surface of a workpiece.

A polishing head including a template that has a thickness thinner than that of a workpiece and thereby avoids contact with a polishing pad, on the other hand, increases the pressure on the outer peripheral portion of the workpiece, thereby excessively polishing the outer peripheral portion to produce the outer circumference sag and hence to lower the flatness of the workpiece. Thus, this polishing head cannot be used for final polishing of a workpiece.

Patent Document 2 proposes another rubber-chuck type of polishing head in which water is enclosed in a fluid enclosing portion of a holding plate having an elastic film formed on its front surface, a volume adjusting screw that is capable of entering and coming out of the fluid enclosing portion is provided, the surface of the elastic film is made uniformly flat by the adjustment and brought into contact with the entire surface of a workpiece to press the workpiece. This method does not involve pressure adjustment by supplying pressurized fluid. For this reason, the inflation of a rubber film at a gap between a template and a workpiece can be inhibited, and the outer circumference sag is thereby suppressed. When there is firm adhesion between the workpiece and a polishing pad because of a flat shape of a workpiece holding surface, however, a problem arises in that the workpiece cannot be detached from the polishing pad after polishing the workpiece.

In addition, in the case of using a soft polishing pad in secondary polishing, the outer circumference sag occurs due to a polishing pad factor. It is accordingly necessary that the template and the workpiece have the same thickness and are simultaneously pressed against the polishing pad. In finish polishing, this configuration allows the template to contact the polishing pad, generating surface defects of the workpiece. Accordingly, another polishing head provided with a template thinner than the workpiece needs to be prepared, that is, secondary polishing and finish polishing cannot be performed with the same polishing head, resulting in a significant problem of workability.

The present invention was accomplished in view of the above-described problems. It is an object of the present invention to provide a polishing head and a polishing apparatus that can uniformly polish a workpiece up to the outermost peripheral portion without generating surface defects, such as scratches, on the workpiece surface and readily detach the workpiece from a polishing pad after polishing.

Solution to Problem

To achieve this object, the present invention provides a polishing head comprising: an annular rigid ring; an elastic film bonded to the rigid ring; and a mid-plate joined to the rigid ring so as to be movable upward and downward, the mid-plate defining a first sealed space together with the rigid ring and the elastic film, the polishing head being configured to hold a back surface of a workpiece on a lower surface of the elastic film and to polish a front surface of the workpiece by bringing the front surface into sliding contact with a polishing pad attached to a turn table, the polishing head further comprising an incompressible fluid enclosed in the first sealed space and a mid-plate positioning means for adjusting a vertical position of the mid-plate, wherein the mid-plate positioning means can adjust a shape of the lower surface of the elastic film by adjusting the vertical position of the mid-plate.

Such a polishing head can appropriately adjust the shape of the lower surface of the elastic film holding the workpiece by adjusting the vertical position of the mid-plate, thereby enabling the workpiece to be uniformly polished up to the outermost peripheral portion while inhibiting surface defects, such as scratches, of the workpiece surfaces. In addition, when the surface shape of the elastic film holding the workpiece is adjusted to be upward convex shape by moving the vertical position of the mid-plate upward, the workpiece can be reliably attached to the polishing head and readily detached from the polishing pad after polishing.

The inventive polishing head preferably has a second sealed space defined by the mid-plate, a polishing head body disposed above the mid-plate, and an upper portion of the rigid ring contacting a lower end of the polishing head body, wherein the mid-plate positioning means adjusts the vertical position of the elastic film by controlling pressure in the second sealed space.

Such a polishing head can adjust the vertical position of the mid-plate to be an optional position, enabling the shape of the lower surface of the mid-plate holding the workpiece to be readily adjusted.

The inventive polishing head may have a stopper for limiting an upper limit position and a lower limit position of the upward and downward movement of the mid-plate.

Such a polishing head can prevent elastic film shape variation exceeding a predetermined range and damage to the elastic film.

The elastic film is preferably composed of a material having a tensile strength of 10 MPa or more.

Such a polishing head can reliably maintain the shape of the lower surface of the elastic film even when being subjected to polishing load applied to the workpiece and frictional resistance occurring between the polishing pad and the workpiece during polishing.

The inventive polishing head preferably has an annular template, for holding an edge portion of the workpiece, disposed concentrically with the rigid ring in a peripheral portion of the lower surface of the elastic film, or a resin ring, for holding the edge portion of the workpiece, disposed concentrically with and outside the rigid ring.

Such a polishing head can inhibit lateral movement of the workplace out of position during polishing. In addition, the workpiece can be uniformly polished up to the outermost peripheral portion by pressing the template or the resin ring against the polishing pad, even in secondary polishing using a soft polishing pad. This polishing head can also change whether the template or the resin ring presses the polishing pad or not by adjusting the vertical position of the mid-plate to change the position of the workplace front surface, and is thus suitable for both secondary polishing and finish polishing.

The annular template preferably has a thickness adjusted within ±1% with respect to a finishing thickness of the workpiece.

Such a polishing head enables more reliable, uniform polishing of the workpiece up to the outermost peripheral portion.

Moreover, when the mid-plate is moved to the lower limit position, the shape of the lower surface of the elastic film is preferably adjusted to be a downward convex shape such that the front surface of the workpiece is located below a lower surface of the template or the resin ring, preferably by a distance ranging from 50 μm to 55% of the finishing thickness of the workpiece.

Such a configuration enables finish polishing in which the template or the resin ring does not press against the polishing pad, thereby reliably inhibiting surface defects. In addition, the vertical position of the mid-plate can readily be adjusted.

Furthermore, the present invention provides a polishing apparatus for use in polishing of a front surface of a workpiece, comprising: a polishing pad attached to a turn table; a polishing-agent-supply mechanism for supplying a polishing agent onto the polishing pad; and the above inventive polishing head for holding the workpiece.

Such a polishing apparatus can appropriately adjust the shape of the lower surface of the elastic film holding the workpiece by adjusting the position of the mid-plate, thereby enabling the workpiece to be uniformly polished up to the outermost peripheral portion while inhibiting surface defects, such as scratches, of the workpiece surfaces. In addition, when the surface shape of the elastic film holding the workpiece is made upward convex by moving the position of the mid-plate upward, the workpiece can be reliably attached to the polishing head and readily detached from the polishing pad after polishing.

Advantageous Effects of Invention

The inventive polishing head has an incompressible fluid enclosed in a first sealed space and can adjust the shape of the lower surface of an elastic film by adjusting the vertical position of a mid-plate with a mid-plate positioning means, thereby uniformly polishing a workpiece up to the outermost peripheral portion while inhibiting occurrence of surface defects, such as scratches, of the workpiece surfaces. The polishing head also enables the workpiece to be readily detached from a polishing pad after polishing, thereby ensuring workpiece transportation.

DESCRIPTION OF EMBODIMENTS

Hereinafter, embodiments of the present invention will be described, but the present invention is not limited to these embodiments.

Conventionally, a method of adjusting pressure on an outer peripheral portion of a workpiece with a template or the like is employed to suppress excessive polishing of the workpiece outer peripheral portion. There is however a problem in that variation in template thickness changes a polishing stock removal of the workpiece outer peripheral portion, resulting in unstable flatness. In the case of finish polishing, contact of the template or the like with a polishing pad causes a problem in that defects occurs on a workpiece surface due to an extraneous substance separated from the template, etc. In addition, if there is firm adhesion between the workpiece and the polishing pad, then the workpiece cannot be detached from the polishing pad after polishing in some cases.

Accordingly, the present inventor diligently studied to solve such problems and consequently found that the configuration in which an incompressible fluid is enclosed in a sealed space defined by a rigid ring, an elastic film, and a mid-plate and the mid-plate is joined to the rigid ring so as to be movable upward and downward enables optimization of the lower surface shape of the elastic film by adjustment of the vertical position of the mid-plate, thereby enabling a workpiece that is flat up to the outermost, peripheral portion to be obtained by polishing. The present inventor also found that adjusting the lower surface of the elastic film to be an upward convex shape by moving the vertical position of the mid-plate upward allows the workpiece to be readily detached from the polishing pad after polishing, thereby bringing the present invention to completion.

The first embodiment of the inventive polishing head will now be described with reference to FIG. 1.

Figure 1:
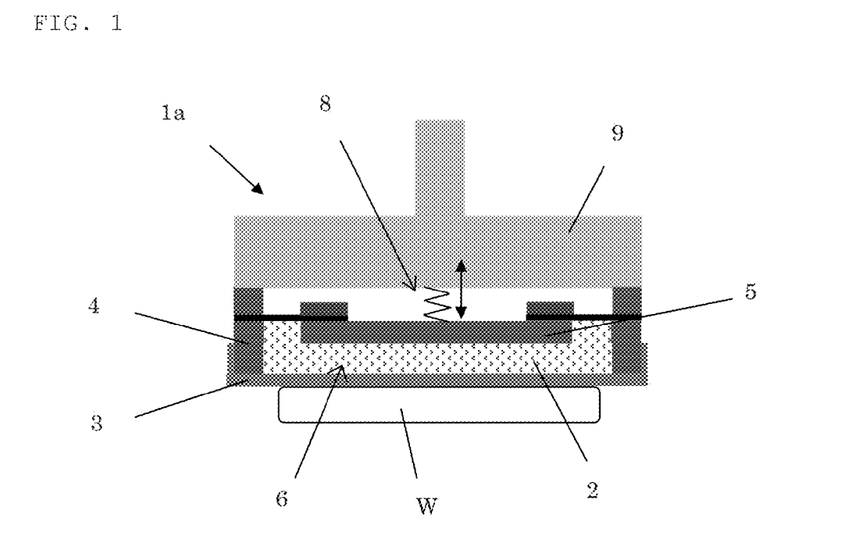
FIG. 1 is a schematic diagram of a first embodiment of the inventive polishing head.

As shown in FIG. 1, the polishing head 1a has an elastic film 3, an annular rigid ring 4, a mid-plate 5, a mid-plate positioning means 8, and a polishing head body 9. The elastic film 3 is bonded on the lower surface side of the rigid ring 4 with uniform tension. The mid-plate 5 is joined to the rigid ring 4 so as to be movable upward and downward. The vertical, position of the mid-plate 5 is adjusted by the mid-plate positioning means 8. A first sealed space 6 is defined by the elastic film 3, the rigid ring 4, and the mid-plate 5. The back surface of a workpiece W is held on the lower surface of the elastic film 3, and the front surface of the workpiece W is polished.

In such a rubber chuck portion, having the elastic film 3, the rigid ring 4, the mid-plate 5, and the like, an incompressible fluid 2 is previously enclosed in the first sealed space 6 before polishing of the workpiece W. As used herein, the term "incompressible fluid" refers to fluid in which its volume is not greatly reduced due to compression when pressure is applied, unlike air. For example, water, an incompressible fluid mainly composed of water, or oil may be used as the incompressible fluid 2.

Use of water or an incompressible fluid mainly composed of water is more preferable because it reduces cost and eliminates a risk of contamination of a workpiece and the interior of a polishing apparatus even though the incompressible fluid 2 leaks from the first sealed space 6, for example, as the elastic film 3 is torn during polishing.

In addition, a polishing agent for use in polishing of the workpiece W, or aqueous solution containing at least one or more components among components of the polishing agent is preferably used to prevent polishing quality of the workpiece W from being affected even through the incompressible fluid 2 leaks from the first sealed space 6. For a workpiece W made of a semiconductor material, pure water, which does not include metal ions and the like, is preferably used as the incompressible fluid 2 to prevent metal contamination, etc.

The material of the rigid ring 4 may be a rigid material, such as stainless steel (SUS). The material and the shape of the mid-plate 5 are not limited in particular, provided the mid-plate 5 can define the first sealed space 6 together with the rigid ring 4, and the rubber film 3.

To join the mid-plate 5 movably upward and downward to the rigid ring 4, for example, the mid-plate 5 and the rigid ring 4 may be joined through a diaphragm, or the mid-plate 5 and the mid-plate positioning means 8 may be connected with a boll screw or air cylinder. The present invention is however not limited thereto.

The adjustment of the vertical position of the mid-plate 5 enables the lower surface shape of the elastic film 3 to be adjusted so as to be, for example, an upward convex shape, a downward convex shape, or a flat shape.

The polishing head body 9 has a pressing unit (not shown) and can apply a pressing load (a pressing force) to the workpiece W.

The material of the elastic film 3 is preferably composed of, but not limited to, a material having a tensile strength (Japanese Industrial Standard (JIS) K6251) of 10 MPa or more, more preferably 20 MPa or more. Such an elastic film can reliably maintain its lower surface shape even when being subjected to a polishing load applied to a workpiece or a frictional resistance occurring between the polishing pad and the workpiece during polishing.

With the inventive polishing head 1a, the adjustment of the vertical position of the mid-plate 5 by the mid-plate positioning means 8 enables the optimization of the lower surface shape of the elastic film 3 holding a workpiece W according to polishing conditions. In addition, since the volume of the incompressible fluid 2 enclosed in the first sealed space 6 hardly changes during polishing, the optimum shape of the lower surface of the elastic film can be maintained and a uniform load can be applied to the entire workpiece W to polish the workpiece W. The workpiece can thereby be uniformly polished up to its outermost peripheral portion, and no surface defects due to separation of an extraneous substance, etc., occur on the workpiece surfaces. In addition, the upward convex surface shape of the elastic film 3, which is formed by moving the vertical position of the mid-plate 5 upward, allows the workpiece both to be reliably attached to the polishing head and to be readily detached from the polishing pad after polishing, resulting in reliable transportation of workpieces.

Figure 2:
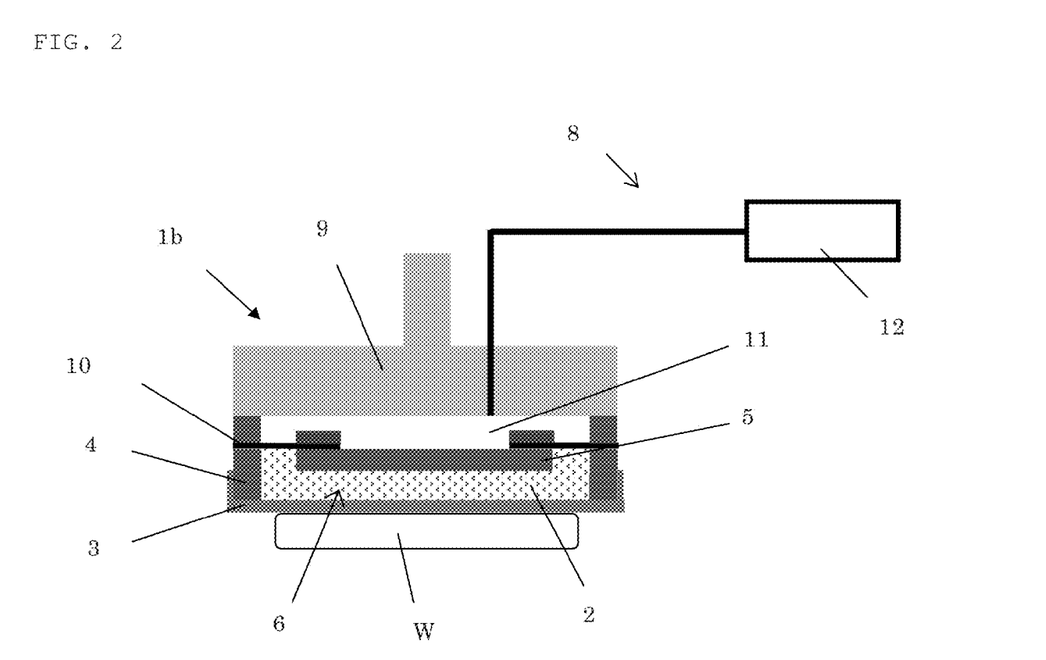
FIG. 2 is a schematic diagram of a second embodiment of the inventive polishing head.

FIG. 2 is a schematic diagram of the second embodiment of the inventive polishing head in which a diagram is used as a joint between the mid-plate 5 and the rigid ring 4.

As illustrated in FIG. 2, the mid-plate 5 of the polishing head 1b is joined to the rigid ring 4 though a diaphragm 10 such that the mid-plate is movable upward and downward. A second sealed space 11 is defined by the mid-plate 5, the polishing head body 9 disposed above the mid-plate 5, an upper portion of the rigid ring 4 that contacts the lower end of the polishing head body 9. The configuration of the mid-plate positioning means 8 employs a pressure controlling apparatus 12 connecting with the second sealed space 11. The pressure controlling apparatus 12 is configured to be capable of reducing and applying pressure to adjust the pressure in the second sealed space 11.

The mid-plate positioning means 8 can thus adjust the vertical position of the mid-plate 5 by controlling the pressure in the second sealed space 11.

The inventive polishing head 1b thus configured can adjustably change the vertical position of the mid-plate 5 to an optional position, enabling the lower surface shape of the elastic film holding a workpiece to be readily optimized.

Figure 3:
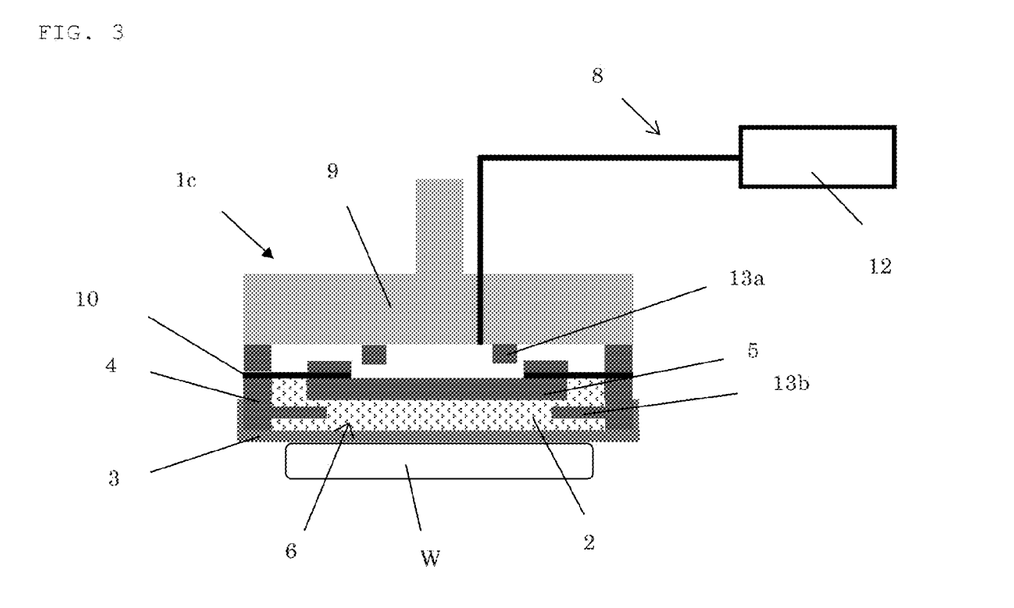
FIG. 3 is a schematic diagram of a third embodiment of the inventive polishing head.

FIG. 3 is a schematic diagram of the third embodiment or the inventive polishing head.

As illustrated in FIG. 3, the polishing head 1c is provided with an upper limit stopper 13a and a lower limit stopper 13b to limit the upper limit position and the lower limit position of the vertical movement of the mid-plate 5.

The inventive polishing head 1c thus configured can inhibit variation in shape of the elastic film 3 beyond a predetermined range and prevent damage to elastic film 3.

Figure 4:
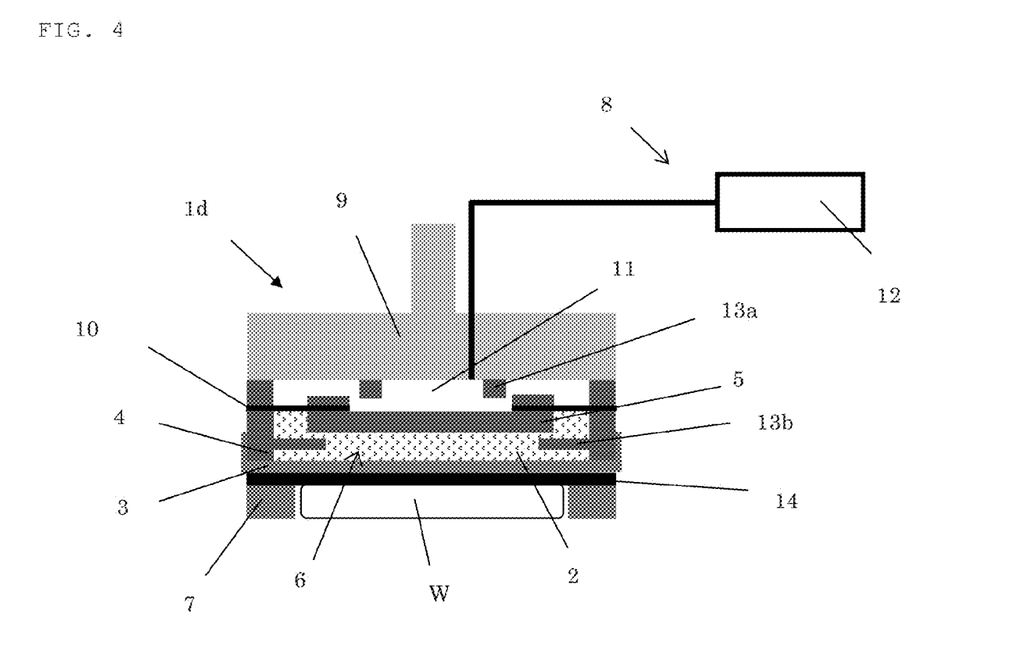
FIG. 4 is a schematic diagram of a forth embodiment of the inventive polishing head.

FIG. 4 is a schematic diagram of the forth embodiment of the inventive polishing head.

As illustrated in FIG. 4, the polishing head 1d is provided with an annular template 7 and a backing film 14 in addition to the configuration of the polishing head 1c illustrated in FIG. 3. The annular template 7 is disposed concentrically with the rigid ring 4 in a peripheral portion of the lower surface of the elastic film 3 and holds an edge portion of the workpiece W. For the purpose of avoiding contamination, scratches, and indentations of a workpiece W, the template 7 is preferably composed of a high abrasion resistant material that is hard to wear by sliding contact with a polishing pad of a polishing apparatus during polishing, and softer than a workpiece W.

The backing film 14 is disposed such that the backing film adheres to at least a portion at which the workpiece W is held of the lower surface of the elastic film 3. After water is included in the backing film 14, the workpiece W is attached to the backing film 14, through which the workpiece W is held on a workpiece holding surface of the elastic film 3. The workpiece W can reliably be held by surface tension of the water contained in the backing film 14. The backing film 14 may be composed of, for example, polyurethane. A commercially available template-assembly having a template attached to the surface of a backing film may also be used.

The above polishing head having the annular template 7 and the backing film 14 can prevent the workpiece W from slipping out of position during polishing, enabling the workpiece to be more stably held.

The template 7 may be configured such that the template has the same thickness as the workpiece W and can press against a polishing pad together with the workpiece W during polishing. Even in secondary polishing using a soft polishing pad, which is easy to cause an outer circumference sag due to particularly a polishing pad factor, such a template enables the workpiece W to be more uniformly polished up to the outermost peripheral portion, thereby effectively inhibiting the outer circumference sag of the workpiece W. In this case, thickness precision of the template 7 is preferably adjusted within ±1% of a finishing thickness of a workpiece because the workpiece can be more reliably uniformly polished up to the outermost peripheral portion.

As described above, since the inventive polishing head can adjust the shape of the lower surface of the elastic film 3 by adjusting the vertical position of the mid-plate 5 with the mid-plate positioning means 8, the vertical position of the front surface of a workpiece W can also be adjusted by the variation in the lower surface shape of the elastic film 3. If the lower surface shape of the elastic film 3 is adjusted to be a downward convex shape, for example, then the vertical position of the front surface of the workpiece W can be adjusted to be below the position of the workpiece when the lower surface shape of the elastic film 3 is flat. In other word, adjusting the vertical position of the mid-plate 5 enables adjustment of a vertical relative distance between the workpiece front surface and the template lower end surface, thereby changing whether or not the template presses the polishing pad.

Accordingly, even when the template and the workpiece have the same thickness, polishing, particularly finish polishing, can be performed without contact of the template with the polishing pad, and the workpiece W can thereby be uniformly polished up to its outermost peripheral portion while occurrence of surface defects on the workpiece is inhibited. The inventive polishing head can thus be used suitably for both second polishing and finish polishing.

Figure 5:
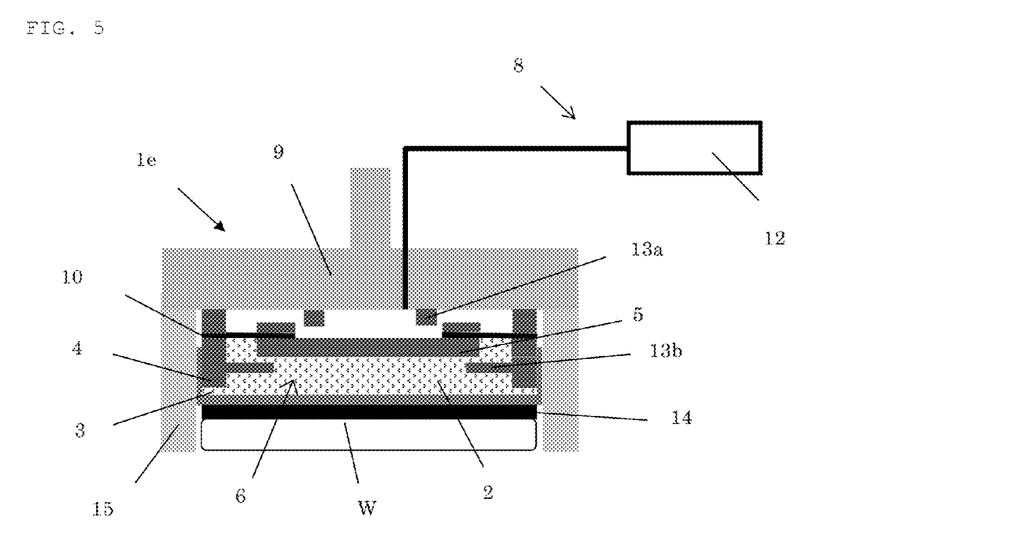
FIG. 5 is a schematic diagram of a fifth embodiment of the inventive polishing head.

FIG. 5 is a schematic diagram of the fifth embodiment of the inventive polishing head.

As illustrated in FIG. 5, the elastic film 3 is bonded only to a side surface of the rigid ring 4. There is a space between the lower end of the rigid ring 4 and the elastic film 3 and the incompressible fluid 2 can enter the space. The polishing head 1e illustrated in FIG. 5 holds the edge portion of the workpiece W with a resin ring 15 that is disposed concentrically with and outside the rigid ring 4, whereas the polishing head 1d illustrated in FIG. 4 holds the edge portion of the workpiece W with the annular template 7.

The above polishing head having the resin ring 15 and the backing film 14 can prevent the workpiece W from slipping out of position during polishing, enabling the workpiece to be more stably held.

The height of the resin ring 15 may be adjusted such that the vertical position of the workpiece front surface is substantially identical to that of the lower end surface of the resin ring 15 when the workpiece W is held with the shape of the elastic film 3 being flat. As in the above description of the polishing head 1d, the polishing head 1e thus configured can simultaneously press the resin ring 15 and the workpiece W against the polishing pad during polishing to more uniformly polish the workpiece up to the outermost peripheral portion of the workpiece.

Figure 6:
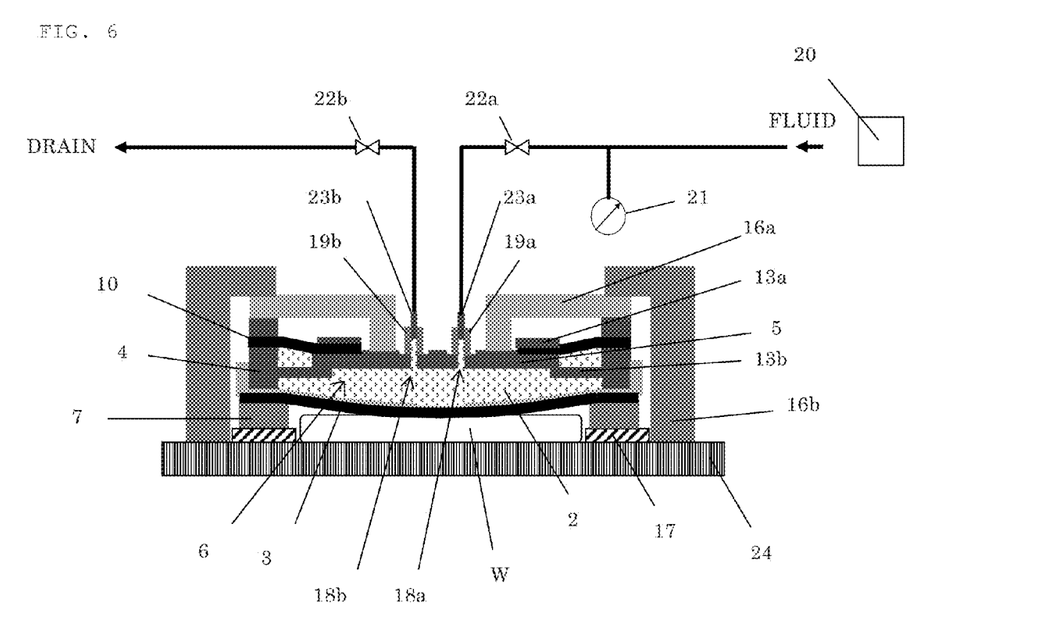
FIG. 6 is an explanatory view of an exemplary method of enclosing an incompressible fluid in a first sealed space.

FIG. 6 shows an exemplary method of enclosing the incompressible fluid 2 in the polishing head 1d illustrated in FIG. 4.

As shown in FIG. 6, two through holes 18a and 18b through which the incompressible fluid 2 is introduced into and discharged from the first sealed space 6 are provided on an upper side of the mid-plate 5. Couplers 19a and 19b are mounted in the through holes 18a and 18b to enclose the incompressible fluid 2 into the first sealed space 6 while pressure on the incompressible fluid 2 is maintained.

The fluid enclosing apparatus 20 has a channel, for introducing the incompressible fluid 2, connected with a manometer 21 and a valve 22a. One end of the channel is connected with a nipple 23a. The nipple 23a is connected with the coupler 19a mounted in the mid-plate 5. The fluid enclosing apparatus 20 also has a channel for discharging the incompressible fluid 2, and in the channel, a drain is connected with one end and a valve 22b is connected to the middle. The other end of this channel is connected with a nipple 23 b. The nipple 23 b is connected with the coupler 19b mounted in the mid-plate 5.

The mid-plate 5 is fixed to the rigid ring 4 through a clamp jig 16a with the mid-plate 5 pressed against the lower limit stopper 13b. A workpiece W or an adjustment plate having the same thickness as the workpiece W is inserted inside the template 7, a spacer 17 for adjustment is then inserted below the lower end surface of the template and placed on a flat base 24 having high hardness. The rigid ring 4 is then fixed to the base 24 through a clamp jig 16b.

Next, valves 22a and 22b are opened to introduce the incompressible fluid 2 into the first sealed space 6, and the first sealed space 6 is deflated. The deflation can be performed by closing the valve 22a, opening the valve 22b, and connecting a pressure reducing circuit to the drain side.

Next, the pressure on the incompressible fluid 2 is adjusted with a pressure adjusting mechanism (not shown) such that the manometer 21 exhibits a predetermined pressure with valves 22a and 22b closed, and the valve 22a is then opened to introduce the incompressible fluid 2 into the first sealed space 6. After it has been confirmed that the manometer 21 exhibits the predetermined pressure, the valve 22a is closed to enclose the incompressible fluid 2 in the first sealed space 6. After the enclosure, the nipples 23a and 23b are detached from the couplers 19a and 19b mounted on the upper portion of the mid-plate 5. After the fluid has been enclosed in such a manner, a polishing head body 9 having a pressing means (not shown) is mounted on the upper surface of the rigid ring 4, and a pressure controlling apparatus is connected with the second sealed space. In such a way, the incompressible fluid 2 is enclosed and the inventive polishing head 1d is formed.

With the inventive polishing head 1d, as illustrated in FIG. 4, after the incompressible fluid 2 has been enclosed in the first sealed space 6 in the above manner, when the pressure in the second sealed space 11 is kept higher with the pressure controlling apparatus 12 as compared with the pressure applied to the workpiece W with the polishing head body 9, polishing is performed with the mid-plate 5 pressed against the lower limit stopper 13b. Even when the template 7 has the same thickness as the workpiece W, finish polishing can thereby be performed without contact of the template 7 with the polishing pad, and the occurrence of defects, such as scratches, on the surface of the workpiece W can be inhibited.

The inventive polishing apparatus will now be described.

Figure 7:
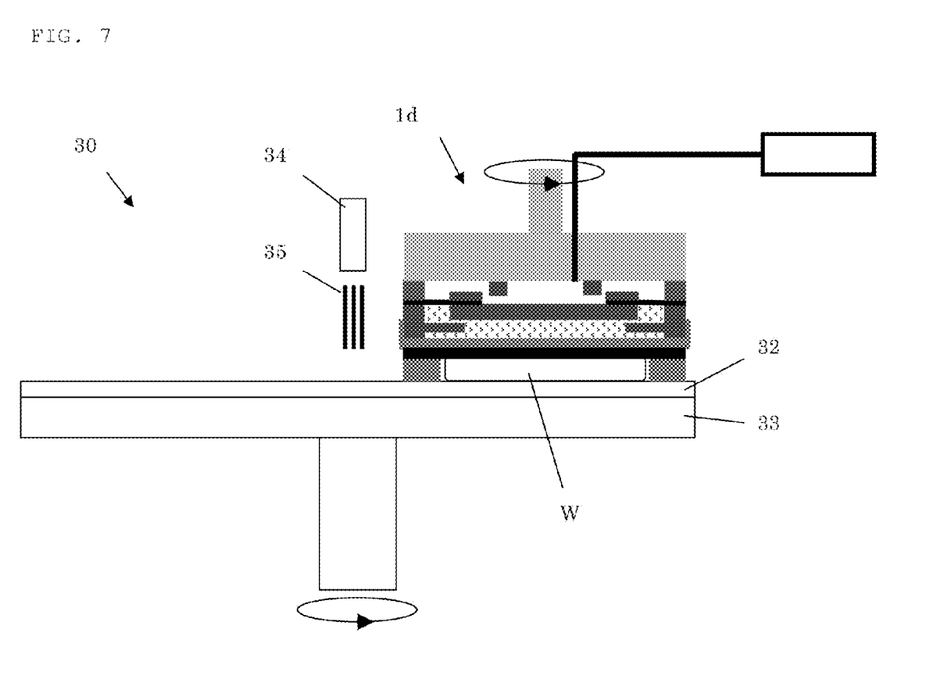
FIG. 7 is a schematic diagram of an example of the inventive polishing apparatus.

FIG. 7 is a schematic diagram of an example of the inventive polishing apparatus.

As described in FIG. 7, the inventive polishing apparatus 30 has a polishing pad 32 attached to a turn table 33, a polishing-agent-supply mechanism 34 for supplying a polishing agent 35 onto the polishing pad 32, and the above-described polishing head 1d for holding a workpiece W. The inventive polishing head 1d has a structure enabling the workpiece W to be pressed against the polishing pad 32 attached to the turn table 33 with a pressing mechanism (not shown).

The polishing apparatus polishes the workpiece W by sliding contact of the front surface of the workpiece W through rotation motion of the polishing head 1d connected with a rotation axis and revolution motion of the turn table 33 while supplying the polishing agent 35 to the polishing pad 32 with the polishing-agent-supply mechanism 34.

The polishing apparatus 30 thus configured can appropriately adjust the lower surface shape of an elastic film holding a workpiece by adjusting the position of a mid-plate, thereby uniformly polishing the workpiece up to the outermost peripheral portion while inhibiting the occurrence of surface defects, such as scratches, on the workpiece surfaces. In addition, the polishing apparatus can reliably attach the workpiece to the polishing head by moving the position of the mid-plate upward to change the surface shape of the elastic film holding the workpiece into an upward convex shape, and readily detach the workpiece from the polishing pad after polishing.

Figure 8A:
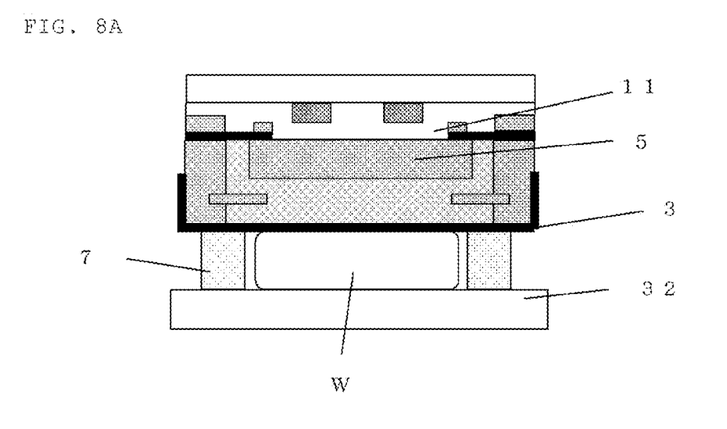
FIG. 8A is a schematic diagram of a state in secondary polishing during polishing processes with the inventive polishing head.
Figure 8B:
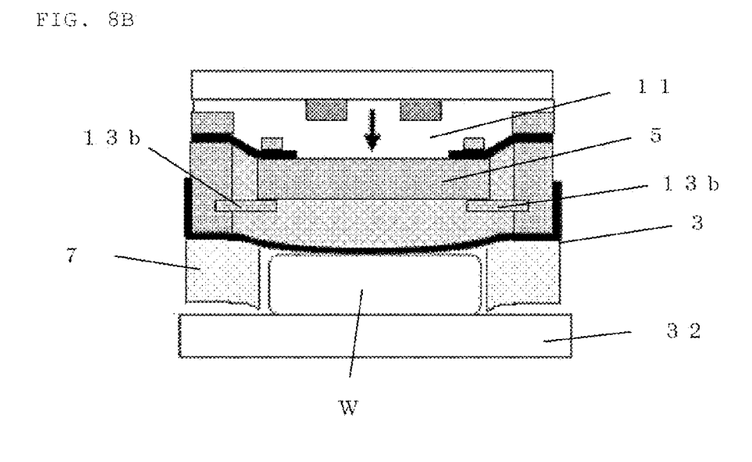
FIG. 8B is a schematic diagram of a state in finish polishing during polishing processes with the inventive polishing head.

In secondary polishing with the polishing apparatus 30, as illustrated in FIG. 8A, the pressure in the second sealed space 11 located above the mid-plate 5 is adjusted such that the workpiece holding surface of the elastic film 3 becomes flat, the mid-plate is fixed at an appropriate position, and polishing is then performed. In finish polishing, as illustrated in FIG. 8B, the pressure in the second sealed space 11 is increased to fix the vertical position of the mid-plate 5 with the mid-plate abutting on the lower limit stopper 13b. The workpiece holding surface of the elastic film 3 thereby becomes downward convex, and polishing can thus be performed without contact of the template 7 with the polishing pad 32.

Figure 8C:
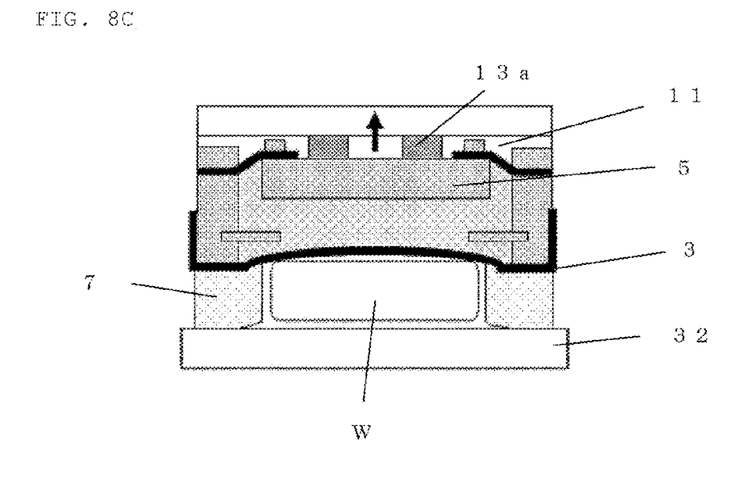
FIG. 8C is a schematic diagram of a state when a workpiece is transported.

When the workpiece is transported after polishing, as illustrated in FIG. 8C, the pressure in the second sealed space 11 is reduced to fix the vertical position of the mid-plate 5 with the mid-plate abutting on the upper limit stopper 13a. The workpiece holding surface of the elastic film 3 thereby becomes upward convex. This surface enables the workpiece W both to be attached thereon and to be readily detached from the polishing pad 32; thus the workpiece can reliably be transported.

EXAMPLE

The present invention will be more specifically described below with reference to examples and comparative examples, but the present invention is not limited to these examples.

Example 1

With the inventive polishing apparatus 30 as illustrated in FIG. 7, a workpiece was polished. With the fluid enclosing apparatus 20 as illustrated in FIG. 6, the polishing head 1d as illustrated in FIG. 4 was prepared as follows. A stainless steel rigid ring having an outer diameter of 360 mm and an inner diameter of 320 mm was used. An EPDM rubber having a tensile strength of 18 MPa, as the elastic film, was bonded to the lower surface of the rigid ring. On the lower surface of the elastic film was attached a commercially available template assembly including a template with an outer diameter of 355 mm, an inner diameter of 302 mm, and a thickness of 730 µm adhering to a surface of a backing film.

A silicon single crystal wafer having a diameter of 300 mm and a thickness of 775 µm was used as the workpiece. The thickness of the spacer for adjustment was 250 µm. Pure water was used as an incompressible fluid and enclosed in the first sealed space with a pressure of 70 KPa. The polishing head was mounted on the polishing apparatus, and secondary polishing followed by finish polishing of the workpiece was then performed. The turn table used had a diameter of 800 mm. A velour type of polishing pad obtained by impregnating nonwoven fabric with urethane was used as a polishing pad for use in secondary polishing; a suede type of polishing pad obtained by forming urethane foam on nonwoven fabric was used as a polishing pad for use in finish polishing.

The silicon single crystal wafer used as the workpiece was previously subjected to primary double-side polishing and edge polishing.

In the secondary polishing, alkali solution containing colloidal silica was used as a polishing agent. The polishing head and the turn table were rotated at 31 rpm and 29 rpm, respectively. The polishing load (pressing force) on the workpiece was set to 15 KPa in terms of contact pressure on the workpiece by a pressing means, not shown. The pressure in the second sealed space was controlled to be 10 KPa with the pressure controlling apparatus such that the workpiece was subjected to the same pressure as the template. The polishing time was adjusted such that the average polishing amount of the workpiece became 1 µm.

Successively, after the secondary polishing, finish polishing of the workpiece was performed with the same polishing head. In the finish polishing, alkali solution containing colloidal silica and minute amounts of water-soluble polymer additives as a wetting agent was used as a polishing agent. The polishing head and the turn table were rotated at 31 rpm and 29 rpm, respectively. The polishing load on the workpiece was set to 15 KPa in terms of contact pressure on the workpiece by a pressing means, not shown. The pressure in the second sealed space was set to a higher pressure with the pressure controlling apparatus such that the mid-plate abutted the lower limit stopper and polishing was performed for 120 seconds with the pressure controlled to be 50 KPa. After the finish polishing, the workpiece was cleaned with ammonia-hydrogen peroxide solution, i.e., SC1 solution, heated to 70° C. to remove the polishing agent from the workpiece surface.

The workpiece was readily detached from the polishing pad by moving the mid-plate upward after the finish polishing.

Variation in polishing stock removal in a plane of the workpiece thus polished was evaluated. The polishing stock removal was calculated in such a manner that the thickness of the workpiece was measured in the range except for a width of 1 mm from the outermost periphery, as a flatness guarantee area, with a flatness measuring instrument before and after polishing, and the differences in the thickness before and after polishing in cross section in a workpiece diameter direction were obtained. Wafer Sight (manufactured by KLA-Tencor) was used as the flatness measuring instrument.

In addition, surface defects on the polished workpiece was evaluated. In the evaluation of the surface defects, the number of defects having a size of 37 nm or more on the workpiece surface was measured with SP-2 manufactured by KLA-Tencor.

Figure 9A:
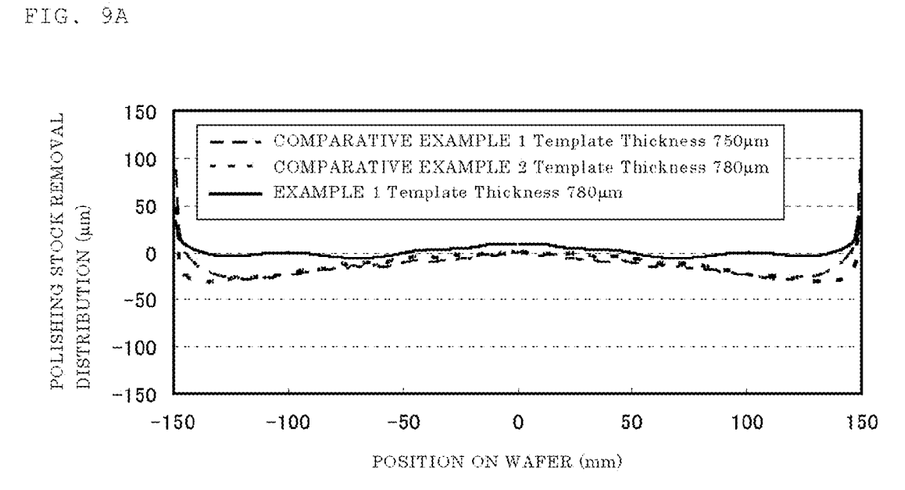
FIGS. 9A and 9B are a graph of polishing stock removal distribution of the workpieces polished in Example 1, and Comparative Examples 1 and 2.
Figure 9B:
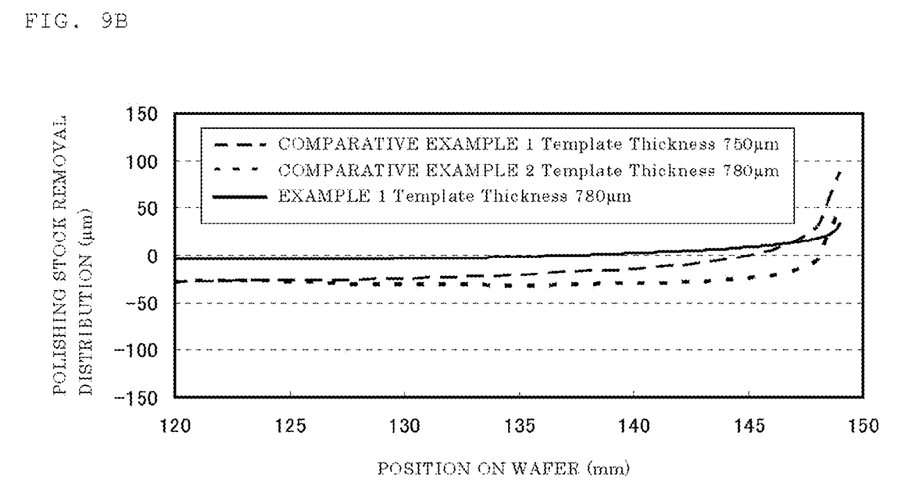

FIGS. 9A and 9B show polishing stock removal distribution of the workpiece polished in Example 1. FIG. 9A shows the whole polishing stock removal distribution; FIG. 9B shows an enlarged view in the positional range on the workpiece from 120 mm to 150 mm. As shown in FIGS. 9A and 9B, substantially uniform polishing was performed inside a position of 3 mm inward away from the outer periphery; although the polishing stock removal slightly increased in the range from 1 mm to 3 mm inward away from the outer periphery, variation in polishing stock removal was 39.6 nm, which was greatly improved compared with the later-described Comparative Example 2 in which the same elastic film and the same template were used.

Figure 12A:
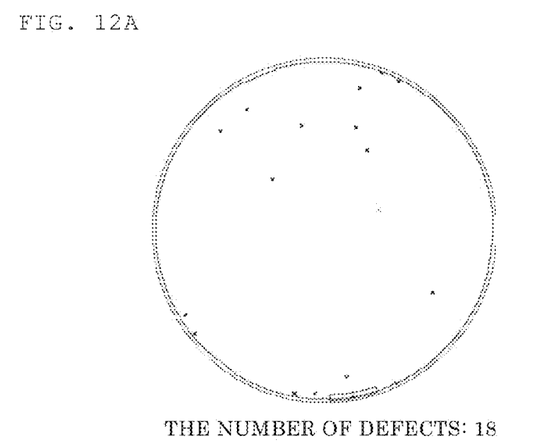
FIG. 12A shows a surface-defect map of the workpiece polished in Example 1.

FIG. 12A shows a surface-defects map of the workpiece polished in Example 1. As shown in FIG. 12A, the number of defects having a size of 37 nm or more on the workpiece surface was 18, which was also greatly improved compared with Comparative Example 2 in which a template having the same thickness as the workpiece was used.

It was thus confirmed that performing secondary and finish polishing with the inventive polishing head and polishing apparatus enables uniform polishing up to the outermost peripheral portion of a workpiece without occurrence of surface defects, such as scratches, on surfaces of the workpiece and easy detachment of the workpiece from a polishing pad after polishing the workpiece.

Examples 2 to 5

Secondary polishing and finish polishing of a workpiece were performed under the same conditions as Example 1 with a silicone rubber having a tensile strength of 8 MPa and a thickness of 2 mm (Example 2), an EPDM rubber having a tensile strength of 12 MPa and a thickness of 2 mm (Example 3), an NBR rubber having a tensile strength of 21 MPa and a thickness of 2 mm (Example 4), or an hydrogen-added NBR rubber having a tensile strength of 37 MPa and a thickness of 2 mm (Example 5) as the elastic film of the polishing head.

Figure 10:
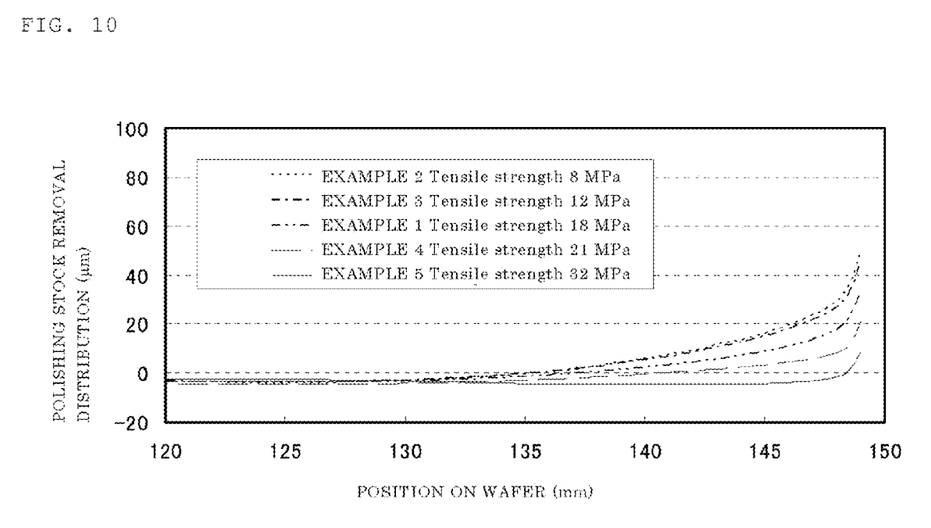
FIG. 10 is a graph of polishing stock removal distribution in Examples 1-5 in which elastic films with different tensile strengths.

FIG. 10 shows the polishing stock removal distribution of the workpieces subjected to the secondary and finish polishing in Examples 2 to 5 in which elastic films each having different tensile strengths were used. As shown in FIG. 10, it was understood that use of an elastic film having a higher tensile strength suppresses increase in polishing stock removal at the outermost peripheral portion, thereby enabling flatter polishing.

Figure 11:
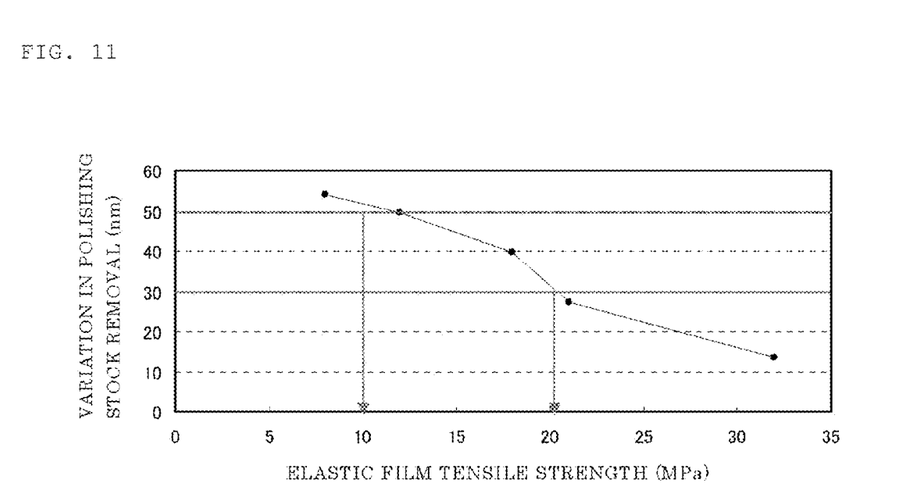
FIG. 11 is a graph of variation in polishing stock removal in Examples 1-5 in which elastic films with different tensile strengths.

FIG. 11 shows the relationship between the tensile strength of the used elastic film and variation in polishing stock removal. The variations in polishing stock removal of the workpieces polished in Examples 2 to 5 were 53.4 nm, 49.7 nm, 27.3 nm, and 13.6 nm. The higher the tensile strength of the elastic film was, the less the variation in polishing stock removal of the workpiece was.

From these results, use of an elastic film composed of a material having a tensile strength of 10 MPa or more is preferable to suppress the variation in polishing stock removal of the workpiece to 50 nm or below. Moreover, use of an elastic film composed of a material having a tensile strength of 20 MPa or more is preferable to suppress the variation in polishing stock removal to 30 nm or below. Use of an elastic film having a high tensile strength thus enables the outer peripheral portion of a workpiece to be more uniformly polished.

Comparative Examples 1 and 2

With a polishing apparatus having a conventional polishing head as illustrated in FIG. 16, a silicon single crystal wafer was polished as in Example 1. A stainless steel rigid ring having an outer diameter of 360 mm and an inner diameter of 320 mm was used and an EPDM rubber having a tensile strength of 18 MPa and a thickness of 2 mm was bonded thereto. On a surface of the EPDM rubber was attached a commercially available template assembly including a template with an outer diameter of 355 mm, an inner diameter of 302 mm, and a thickness of 750 μm (Comparative Example 1) adhering to a surface of a backing film. The polishing head was mounted on the polishing apparatus as illustrated in FIG. 13, and secondary followed by finish polishing of the workpiece was then performed.

A turn table having a diameter of 800 mm was used, and a velour type of polishing pad obtained by impregnate nonwoven fabric with urethane was used as a polishing pad for use in secondary polishing; a suede type of polishing pad obtained by forming urethane foam on nonwoven fabric was used as a polishing pad for use in finish polishing.

The silicon single crystal wafer used as the workpiece was previously subjected to primary double side polishing and edge polishing.

In the secondary polishing, alkali solution containing colloidal silica was used as a polishing agent. The polishing head and the turn table were rotated at 31 rpm and 29 rpm, respectively. Compressed air was introduced into the sealed space 146 while internal pressure was controlled to be 15 KPa by the pressure-adjusting mechanism 150, whereby the workpiece was subjected to a polishing load of 15 KPa. The polishing time was adjusted such that the average polishing amount or the workpiece became 1 μm.

Successively, after the secondary polishing, finish polishing of the workpiece was performed with the same polishing head. In the finish polishing, alkali solution containing colloidal silica and minute amounts of water-soluble polymer additives as a wetting agent was used as a polishing agent. The polishing head and the turn table were rotated at 31 rpm and 29 rpm, respectively. Compressed air was introduced into the sealed space 146 while internal pressure was controlled to be 15 KPa by the pressure-adjusting mechanism 150, whereby the workpiece was subjected to a polishing load of 15 KPa. Polishing was performed for 120 seconds. After the finish polishing, the workpiece was cleaned with ammonia-hydrogen peroxide solution, i.e., SC1 solution, heated to 70° C. to remove the polishing agent from the workpiece surface.

A polishing head in which a template assembly having a template thickness of 780 μm (Comparative Example 2) was attached was also prepared. A workpiece was polished under the same conditions as Comparative Example 1.

The variation in polishing stock removal in a plane of the workpieces polished in the above manner was evaluated as in Example 1. The surface defects on the polished workpieces were also evaluated as in Example 1.

FIG. 9 show the polishing stock removal distribution of the workpieces polished in Comparative Examples 1 and 2. In Comparative Example 1, increase in polishing stock removal was seen in the vicinity of a position of 25 mm inward away from the outer periphery, and rapid increase in polishing stock removal was seen in the range from 1 mm to 3 mm inward away from the outer periphery. The variation in polishing stock removal was 116.2 nm. In Comparative Example 2 in which the template had a thickness of 780 μm, which was close to the thickness of the workpiece, although the increase in polishing stock removal in the range from the outer periphery to 25 mm inward was improved and uniform polishing was performed inside a position of 3 mm inward away from the outer periphery, the rapid increase in polishing stock removal in the range from 1 mm to 3 mm inward away from the outer periphery was not improved. The variation in polishing stock removal was 81.2 nm.

Figure 12B:
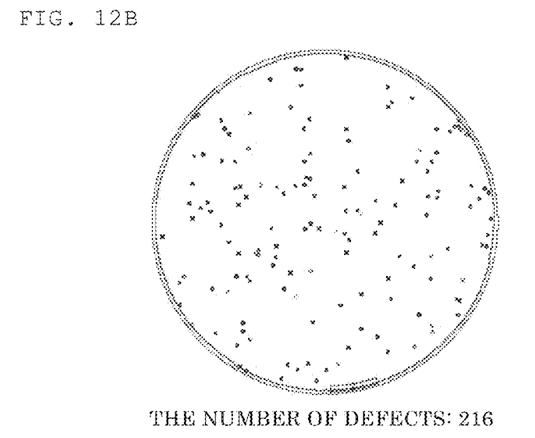
FIG. 12B shows a surface-defect map of the workpiece polished in Comparative Example 1.
Figure 12C:
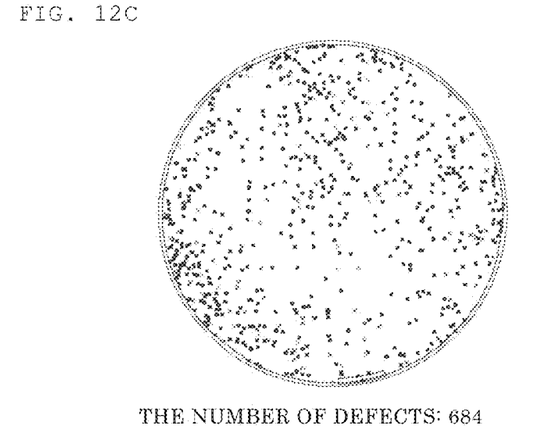
FIG. 12C shows a surface-defect map of the workpiece polished in Comparative Example 2.

FIGS. 12B and 12C show the surface-defects map of the workpieces polished in Comparative Examples 1 and 2. In Comparative Example 1 in which the template thickness was 750 μm, the number of defects was 216; in Comparative Example 2 in which the template thickness was 730 μm, the number of defects was 684. In Comparative Example 2, since the template thickness was thicker, and the template continued to contact a polishing pad for finish polishing, the number of defects increased compared with Comparative Example 1.

As described above, the combination of the secondary and finish polishing using the same polishing head in Comparative Examples 1 and 2 failed to effect the combination of polishing with uniform polishing stock removal and inhibition of occurrence of defects.

It is to be noted that the present invention is not limited to the foregoing embodiment. The embodiment is just an exemplification, and any examples that have substantially the same feature and demonstrate the same functions and effects as those in the technical concept recited in claims of the present invention are included in the technical scope of the present invention. For example, the inventive polishing head is not limited to embodiments shown in FIGS. 1 to 5; requirements other than the recitation in claims, such as the shape of the polishing head body, may be appropriately designed. In addition, the configuration of the polishing apparatus is not limited to FIG. 7; the polishing apparatus may be provided with, for example, a plurality of the inventive polishing heads.

The invention claimed is:

1. A polishing head comprising:
an annular rigid ring; an elastic film bonded to the rigid ring;
a mid-plate joined to the rigid ring so as to be movable upward and downward, the mid-plate defining a first sealed space together with the rigid ring and the elastic film;

an incompressible fluid enclosed in the first sealed space;
a mid-plate positioning means for adjusting a vertical position of the mid-plate;
a second sealed space defined by the mid-plate, a polishing head body disposed about the mid-plate, and an upper portion of the rigid ring contacting a lower end of the polishing head body; and
a stopper for limiting an upper limit position and a lower limit position of the upward and downward movement of the mid-plate; wherein
the polishing head is configured to hold a back surface of a workpiece on a lower surface of the elastic film and to polish a front surface of the workpiece by bringing the front surface into sliding contact with a polishing pad attached to a turn table, and
the mid-plate positioning means can adjust a shape of the lower surface of the elastic film by adjusting the vertical position of the mid-plate and the mid-plate position means adjusts the vertical position of the mid-plate by controlling pressure in the second sealed space.

2. The polishing head according to claim 1, wherein the elastic film is composed of a material having a tensile strength of 20 MPa or more.

3. The polishing head according to claim 2, further comprising an annular template for holding an edge portion of the workpiece, the template being disposed concentrically with the rigid ring in a peripheral portion of the lower surface of the elastic film.

4. The polishing head according to claim 3, wherein the annular template has a thickness adjusted within ±1% with respect to a finishing thickness of the workpiece.

5. The polishing head according to claim 2, further comprising a resin ring for holding the edge portion of the workpiece, the resin ring being disposed concentrically with and outside the rigid ring.

6. The polishing head according to claim 5, wherein when the mid-plate is moved to the lower limit position, the shape of the lower surface of the elastic film is adjusted to be a downward convex shape such that the front surface of the workpiece is located below a lower surface of the template or the resin ring.

7. The polishing head according to claim 6, wherein when the mid-plate is moved to the lower limit position, the front surface of the workpiece is located below the lower surface of the template or the resin ring by a distance ranging from 50 µm to 55% of the finishing thickness of the workpiece.

8. A polishing apparatus for use in polishing of a front surface of a workpiece, comprising:
a polishing pad attached to a turn table; a polishing-agent-supply mechanism for supplying a polishing agent onto the polishing pad; and the polishing head for holding the workpiece according to claim 7.

9. The polishing head according to claim 1, wherein the elastic film is composed of a material having a tensile strength of 10 MPa or more.

10. The polishing head according to claim 1, further comprising an annular template for holding an edge portion of the workpiece, the template being disposed concentrically with the rigid ring in a peripheral portion of the lower surface of the elastic film.

11. The polishing head according to claim 10, wherein the annular template has a thickness adjusted within ±1% with respect to a finishing thickness of the workpiece.

12. The polishing head according to claim 10, wherein when the mid-plate is moved to the lower limit position, the shape of the lower surface of the elastic film is adjusted to be a downward convex shape such that the front surface of the workpiece is located below a lower surface of the template or the resin ring.

13. The polishing head according to claim 12, wherein when the mid-plate is moved to the lower limit position, the front surface of the workpiece is located below the lower surface of the template or the resin ring by a distance ranging from 50 µm to 55% of the finishing thickness of the workpiece.

14. The polishing head according to claim 1, further comprising a resin ring for holding the edge portion of the workpiece, the resin ring being disposed concentrically with and outside the rigid ring.

15. A polishing apparatus for use in polishing of a front surface of a workpiece, comprising:
a polishing pad attached to a turn table; a polishing-agent-supply mechanism for supplying a polishing agent onto the polishing pad; and the polishing head for holding the workpiece according to claim 1.

* * * * *